SEMICONDUCTOR INTEGRATED CIRCUIT APPARATUS

Filed May 16, 1966 3 Sheets-Sheet 1

INVENTOR.
ALVA I. ARCHER
BY Bruce C. Lutz
ATTORNEY

INVENTOR.
ALYA I. ARCHER
BY Bruce C. Lutz
ATTORNEY

INVENTOR.
ALVA I. ARCHER

BY Bruce C. Lutz

ATTORNEY

United States Patent Office 3,402,330

Patented Sept. 17, 1968

3,402,330

SEMICONDUCTOR INTEGRATED CIRCUIT APPARATUS

Alva I. Archer, Clearwater, Fla., assignor to Honeywell Inc., Minneapolis, Minn., a corporation of Delaware Filed May 16, 1966, Ser. No. 550,224
9 Claims. (Cl. 317—235)

ABSTRACT OF THE DISCLOSURE

Multi-emitter transistor gating arrays where some of the emitters are used for inputs and at least one emitter is used for an output are shown.

This invention relates to integrated circuits and more specifically to gating arrays integrated on a single chip of semiconductor.

A multi-emitter transistor is a transistor with one collector and one base and a plurality of emitters. Multi-emitter transistors are well known and have been used in a variety of logic circuitry. The essence of this invention is the recognition that a single multi-emitter transistor can be used as an AND gate. The collector of the multi-emitter transistor is connected to a fixed supply voltage and the base is connected to a current source so that all of the switching may be performed by signals applied to the emitters. Any emitter which is held at ground potential will provide a current sink for the base current, provided the input source is a relatively low impedance source. When all of the input emitters are driven positive, the base current will be shunted out of any other emitter through which it can flow. Thus, by defining a ground potential as a logical "0" and a positive potential as a logical "1" the multi-emitter transistor becomes an AND gate with the output signal taken from an emitter which is not connected to an input source.

This invention may also take the form of a word translator. In this form, the invention translates one digital word into a second digital word. The emitters of a multi-emitter transistor are divided into input and output emitters. The input groups are connected to receive binary signals and when a particular binary word is applied to the input emitters, the potential of the output emitters is raised. By arranging these digital word translators in an array, a fixed read-only memory is provided.

The basic AND gate structure of this invention may be extended to provide circuitry for performing AND-OR logic. When the output emitters of the transistors are tied together and the common junction is connected to the base of a transistor, the output signals on any output emitter will switch the transistor thereby providing an OR function to OR the outputs of the AND gates.

A further novel feature of this invention is the unique manner in which the circuitry may be integrated. In one successful embodiment of this invention a digital word translator was integrated on a single chip of semiconductor with one collector, 64 bases deposited on the one collector, and 36 emitters deposited on each of the bases. In addition, the transistors for the OR gates were placed on the edge of the integrated circuit chip.

Accordingly, it is an object of this invention to provide a novel integrated circuit.

It is another object of this invention to provide a novel AND gate.

It is another object of this invention to provide novel AND-OR logic circuitry.

It is another object of this invention to provide a novel digital word translator.

These and other objects and advantages of this invention will become evident to those skilled in the art upon the reading of this specification in conjunction with accompanying claims and drawings, of which:

Figure 1:
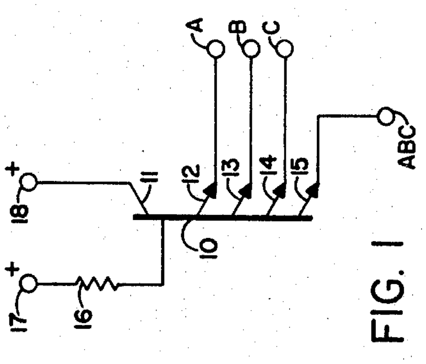
FIGURE 1 is a schematic drawing of a multi-emitter transistor used in an AND gate.

Referring to FIGURE 1, there is shown a multi-emitter transistor means with a base means 10, a collector means 11, and emitter means 12, 13, 14 and 15. Base means 10 is connected through a resistance means 16 to a positive potential source 17 and collector means 11 is connected to a positive potential source 18. Emitter means 12, 13 and 14 are connected to terminals A, B and C, respectively. Emitter means 15 is connected to a terminal ABC.

Current will flow from potential source 17 through resistance 16 and base 10 to the emitters 12–15. Current will also flow from potential source 18 through collector 11 and base 10 to the emitters 12–15. If terminals A, B and C are all "grounded," the current flowing from base 10 to the emitters will be shunted out emitters 12–14 to ground. If terminal A is made positive, current will still flow out emitters 13 and 14. As long as any of the terminals A, B and C are at ground potential or negative, no current will flow out emitter 15 and a low potential will be maintained on emitter 15. However, when all of terminals A, B and C are made positive, emitter 15 will also go positive if it is connected to a relatively high impedance load. Current will tend to flow from emitter 15 to terminal ABC and through any load connected thereto. If a negative or ground signal applied to terminals A, B or C is defined as a logical "0" and a positive voltage applied to these terminals is defined a logical "1," the signal on emitter 15 is a logical ABC or AND function.

Figure 2:
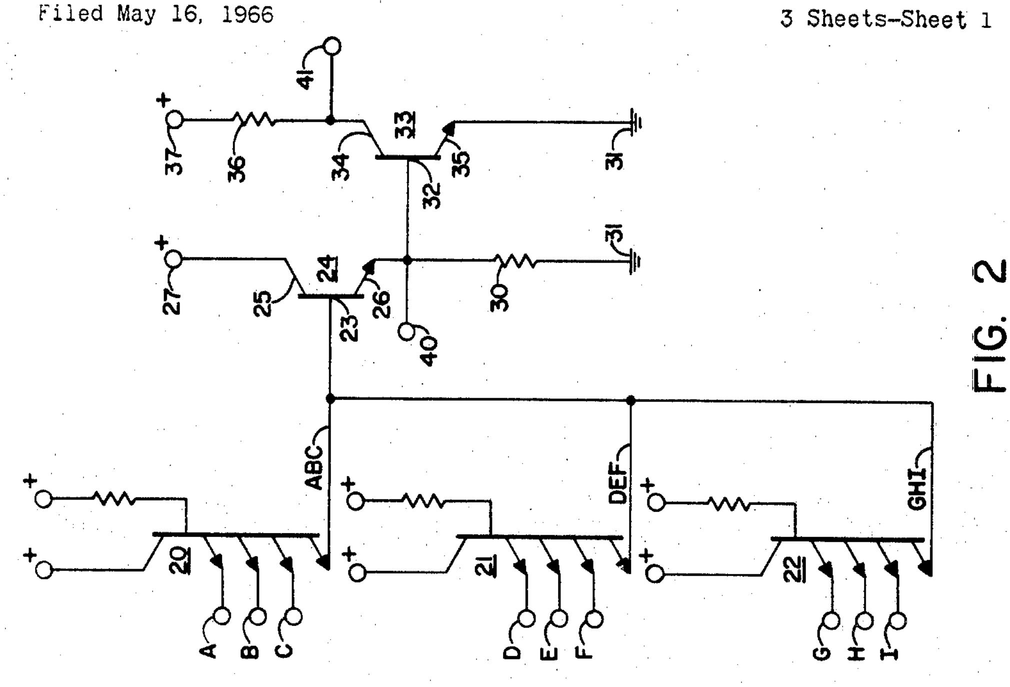
FIGURE 2 is a schematic drawing of multi-emitter transistors used in AND-OR logic circuitry.

Referring to FIGURE 2, there is shown three multi-emitter transistor means 20, 21 and 22. Each of these transistors is connected as an AND gate identical to that described with reference to FIGURE 1. Logical input signals A, B and C are applied to three emitter means of transistor means 20 and the logical output signal ABC is taken from a fourth emitter means as in FIGURE 1. Transistor means 21 provides a logical AND of input signals D, E and F. Transistor means 22 provides a logical AND of input signals G, H and I. The output emitters of each of the transistors 20, 21 and 22 are tied together and the common junction is connected to a base means 23 of a transistor means 24 which further has a collector means 25 and an emitter means 26. Collector means 25 is connected to a positive potential source 27 which may be the same source as positive source 18. Emitter means 26 of transistor 24 is connected through a resistance means 30 to a common conductor or ground 31 and is further connected to a base means 32 of a transistor means 33. Transistor means 33 further has a collector means 34 and an emitter means 35. Emitter means 35 is directly connected to ground 31 and collector means 34 is connected through a resistance means 36 to a positive potential source 37. Emitter means 26 of transistor means 24 is further connected to an output terminal 40 and collector means 34 of transistor means 33 is further connected to an output terminal 41. Output terminals 40 and 41 are optional so that either or both may be used depending upon the desired logic function.

Output signals from transistors 20, 21 and 22 are coupled to the base 23 of transistor 24 to switch transistor 24 ON thereby causing emitter 26 of transistor 24 to go positive. When emitter 26 goes positive, base 32 of transistor 33 also goes positive so that transistor 33 switches ON. When transistor 33 switches ON, the collector 34 drops from a positive potential to substantially ground potential. Thus, it is seen that the output signal at terminal 40 is the logical OR function ABC+DEF+GHI. The output signal at terminal 41 is the logical inverse of the output signal at terminal 40. That is, the signal at terminal 41 is $\overline{ABC+DEF+GHI}$.

From the above description of FIGURES 1 and 2 it is evident that a wide variety of logic functions can be provided by the AND-OR logic structure. The output signals at terminals 40 and 41 could be used to drive other multi-emitter transistors so that very complex logic circuitry could be built up from the basic AND gate structure. It is to be realized that this invention is not to be limited to transistors with three emitters. Both additional input emitters and output emitters may be provided. It should also be realized that the logic functions may be redefined to provide OR logic. The input emitters of the multi-emitter transistors may normally be held positive so that the output signals is also positive. Then whenever one of the input signals drops to a low potential, the output signal will also drop in potential thereby providing an OR function.

Figure 3:
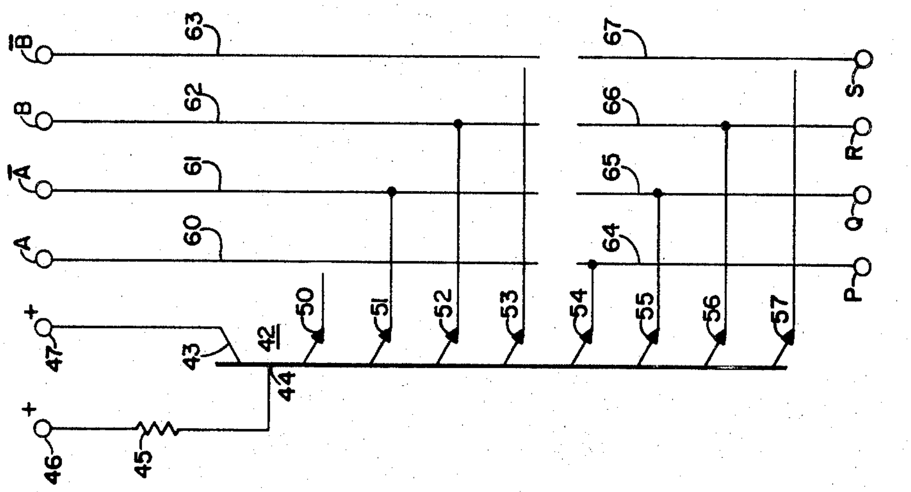
FIGURE 3 is a schematic drawing of a simplified digital word translator.
Figure 4:
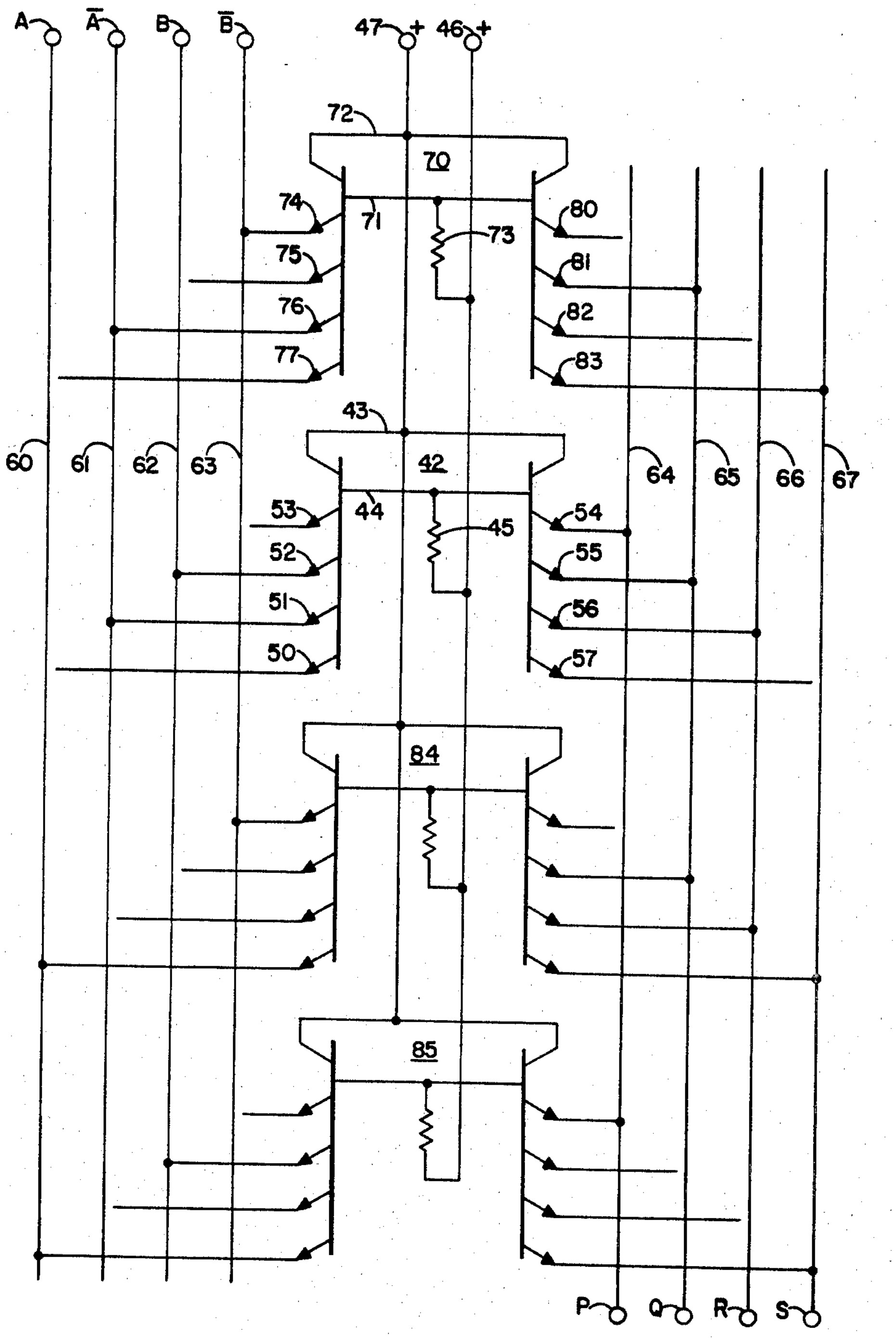
FIGURE 4 is a schematic drawing of an extension of FIGURE 3.
Figure 5:
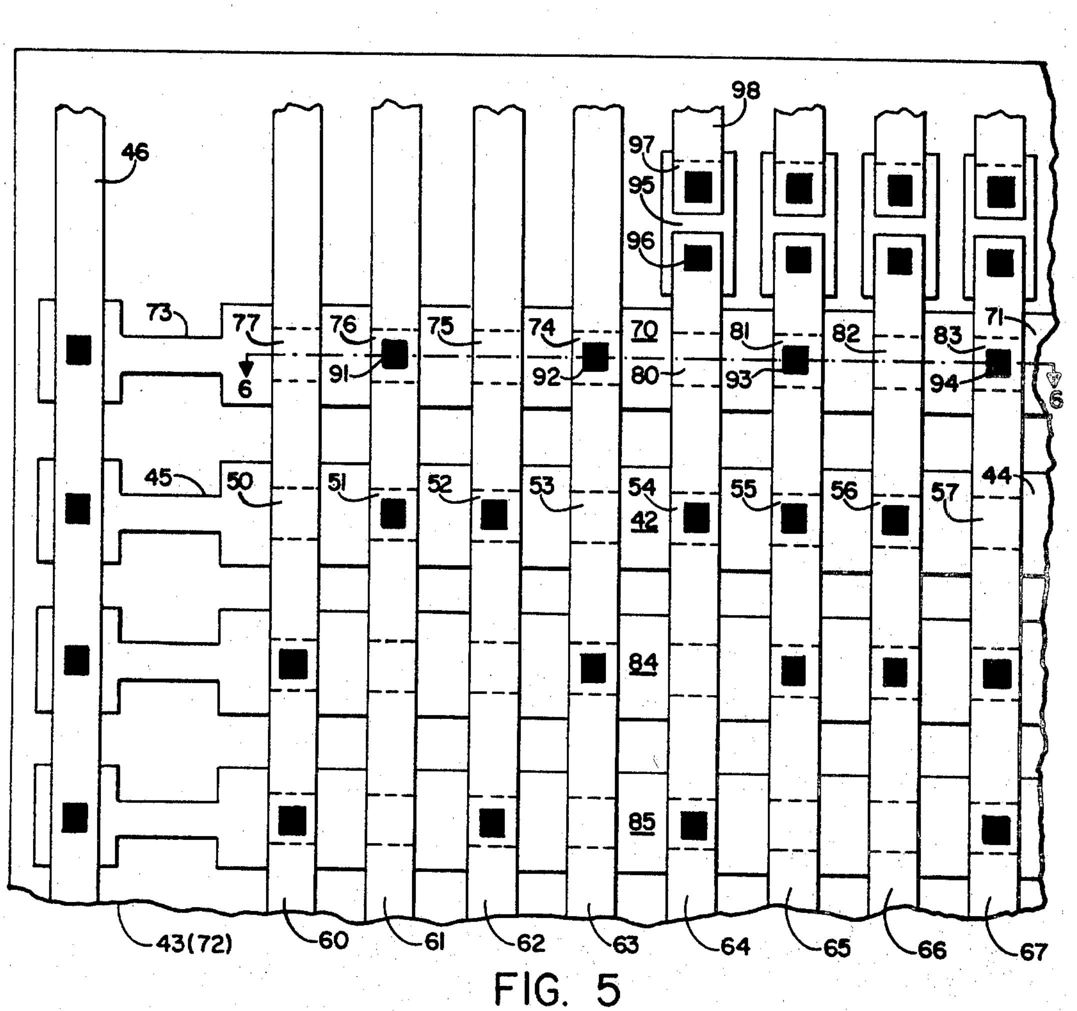
FIGURE 5 shows a drawing of the integrated circuit of this invention.

FIGURE 3 shows a simplified version of a digital word translator which will be further expanded in FIGURES 4 and 5. In FIGURE 3 there is shown a transistor means 42 with a collector means 43 and a base means 44. Base means 44 is connected through a resistance means 45 to a positive source 46. Collector means 43 is connected to a positive source 47. Transistor means 42 further has a plurality of emitter means 50–57. Emitters 50–53 are the input emitters and emitters 54–57 are the output emitters.

Four input terminals A, $\overline{A}$, B, and $\overline{B}$ are shown connected to input lines 60, 61, 62 and 63, respectively. Emitter 51 is connected to input line 61 and emitter 52 is connected to input line 62. If emitters 50 and 53 were connected, which they are not, they would be connected to input lines 60 and 63, respectively. The A and $\overline{A}$ inputs are logical inverses of each other. Similarly the B and $\overline{B}$ inputs are logical inverses of each other. The reason why both the input and its inverse are used is that in the word translator only logical "1" or positive inputs can be used to select a transistor. This will become more evident from an understanding of FIGURE 4.

Output emitter 54 is connected to an output line 64 which is further connected to an output terminal P. Output emitter 55 is connected to an output line 65 which is further connected to an output terminal Q. Output emitter 56 is connected to an output line 66 which is further connected to an output terminal R. Output emitter 57 is not used, however, if it were used it would be connected to an output line 67 which is connected to an output terminal S.

When an input signal $A=0$ ($\overline{A}=1$) and $B=1$ ($\overline{B}=0$) occurs, transistor 42 will be uniquely selected. As emitters 50 and 53 are not connected, current cannot flow out of these input emitters so that the base current is shunted out of emitters 54, 55, and 56 into loads connected thereto. The load may be a transistor similar to that shown in FIGURE 2. Thus, transistor 42 translates an input signal 01 into an output signal 1110. Any other pattern of connections of emitters 54–57 to output lines 64–67 could have been used so that the input word 01 could have been translated into any four-bit binary word.

Referring now to FIGURE 4, all of the components shown in FIGURE 3 are also shown in FIGURE 4 and are numbered the same. Transistor 42 is shown as if it had two bases, however, this method of illustration is used merely for convenience and clarity. In FIGURE 4 there is also shown a transistor means 70 with a base means 71 and a collector means 72. It will be realized from an understanding of FIGURE 5 that collector 72 of transistor 70 may be the same as collector 43 of transistor 42. Collector 72 of transistor 70 is connected to the positive potential source 47 and base 71 is connected through a resistive means 73 to the positive source 46.

Transistor 70 further has a plurality of input emitter means 74, 75, 76, and 77 which are adapted to be connected to input lines 60–63, respectively. Transistor 70 further has output emitter means 80, 81, 82, and 83 which are adapted to be connected to output lines 64–67, respectively.

When the input signal $A=0$ ($\overline{A}=1$), $B=0$ ($\overline{B}=1$) occurs, emitters 74 and 76 will rise in potential. As the base current cannot flow out emitters 75 and 77, it will be shunted out emitters 80–83. By selectively connecting emitters 80–83 to output lines 64–67 a unique pattern of binary signals will occur at the output terminals when the input signal is 00. In the particular configuration shown in FIGURE 4 emitter 81 is connected to output line 65 and emitter 83 is connected to output line 67 so that transistor 70 translates the input signal 00 to the output signal 0101.

Transistor means 84 and 85, which are similar to transistor means 42 and 70, are also shown. Transistor means 84 has input emitter connected to lines 60 and 63 and output emitter means connected to output lines 65, 66, and 67. Thus transistor means 84 translates the binary input word 10 to the binary output word 0111. Transistor 85 has input emitter means connected to input lines 60 and 62 and output emitter means connected to output lines 64 and 67. Thus, transistor 85 translates the input word 11 to the output word 1001.

It is evident that when a two-bit input word is used, it can be used to uniquely select only 4 transistors. If a three-bit input word is used, it can be used to uniquely select 8 transistors, etc. The only limitation on the number of bits in the output word is the size of transistor which can be physically realized. Thus, input words of any length can be translated into output words of any length desired. In actual practice a 36 emitter transistor has been realized. However, there is no reason why more or fewer emitters could not be deposited on one base so as to extend the number of input and output bits which may be used.

Figure 6:
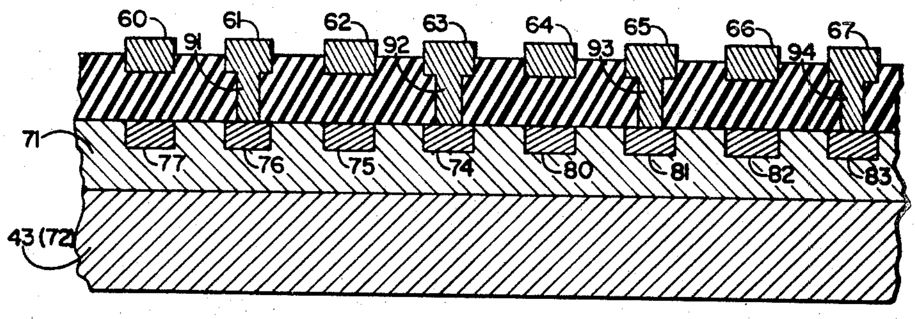
FIGURE 6 shows a sectional view of FIGURE 5.

FIGURES 5 and 6 show an integrated version of the circuitry shown in FIGURE 4. The same numbers are used to designate like components. FIGURE 6 is a cross section taken along base 71 of transistor 70 shown in FIGURE 5. A substrate of n-type semiconductor material comprises the collector region or means 43(72). A plurality of p-type layers or regions comprising the base regions or means of the transistor are diffused into the collector region. The emitter regions or means are then diffused into the base regions and an $SiO_2$ layer is placed over the entire surface of the semiconductor chip. The $SiO_2$ material is etched away at 91, 92, 93, and 94 so that contacts may be selectively made to the emitters. Note that all of the emitters are formed but contacts are selectively made as is desired. Alternatively, the emitters could be selectively formed so that only the desired emitters would be deposited. The next step in forming the structure of FIGURE 5 is to apply the conductors 60–67 in parallel strips orthogonal to the bases to form the input and output lines and the specific emitter connections. As was mentioned above, this technique has been used to form a circuit with one collector, 64 bases deposited on the collector, and 36 emitters deposited on each of the bases.

Leads 64–67 are connected to base regions or of transistors similar to the base 23 of transistor 24 as shown in FIGURE 2. For example, conductor 64 is shown as connected to the base region 95 of an output transistor. The contact is made through the $SiO_2$ layer at junction 96. An emitter region or means 97 is also formed on the base region 95 and an output conductor 98 is connected to the emitter region 97. This output transistor 10 may use the same collector region as the matrix array.

Having thus described in my invention, it will be evident to those skilled in the art that many modifications may be made within the spirit and scope of my invention. Accordingly, I desire to be limited solely by the scope of the appended claims.

I claim as my invention:

1. A multi-emitter transistor gate means having a collector means, a base means, and a plurality of emitter means, comprising, in combination:
potential supplying means:
means connecting said potential supplying means to the collector means;
current supplying means connected to the base means;
input means having a low impedance, said input means alternatively providing first signals of a particular potential and second signals of a potential other than said particular potential;
means connecting said input means to some of the emitter means; and
output means connected to other of the emitter means, said output means receiving signals from the emitter means connected thereto when said first signals are applied to all of said emitter means which are connected to said input means.

2. Apparatus for providing a logical AND function from a biased multi-emitter transistor means comprising:
means for applying logical input signals of predetermined potentials to some of the emitters of the multi-emitter transistor means; and
means for receiving an output signal from at least one of the emitters of said transistor means, the output signal being provided when all of the input signals are of a particular potential.

3. Semi-conductor translating means comprising, in combination:
collector means;
means connected to said collector means for supplying an energization potential thereto;
a plurality of first base means associated with said collector means;
means connected to said first base means for supplying an energization current thereto;
a plurality of first emitter means associated with each of said first base means;
input means connected to selected ones of said first emitter means, said input means alternatively providing first and second signals of predetermined potentials, the connections of said input means to said first emitter means being such that a particular set of input signals uniquely selects only one of said first base means;
output means connected to selected ones of said first emitter means whereby said output means receives output signals from said first emitter means connected thereto when one of said first base means is uniquely selected by said input signals;
transistor means having second base means and second emitter means; and
means connecting said second base means to said output means.

4. Semiconductor translating means comprising, in combination:
collector means;
means connected to said collector means for supplying an energization potential thereto;
a plurality of base means deposited on said collector means;
a plurality of emitter means deposited on each of said base means;
a plurality of first conductor means selectively connected to said emitter means, each of said first conductor means being connected not to more than one emitter means of each of the pluralities of emitter means;
input means connected to said first conductor means for supplying input signals to said first conductor means;
a plurality of second conductor means selectively connected to said emitter means, said second conductor means being selectively energized through said emitter means connected thereto when said input signals are applied to each of the first conductor means connected to emitter means; and
output means connected to said second conductor means, said output means for sensing the energized ones of said second conductor means.

5. Semiconductor translating means as defined in claim 4 wherein said output means includes a plurality of second base means deposited on said collector means and emitter means deposited on said second base means, each of said second base means being connected to one of the said second conductors.

6. Semiconductor apparatus comprising, in combination:
a first region;
a plurality of second regions positioned substantially parallel to each other on said first region;
a plurality of third regions, positioned in a matrix array on said second region, said first and third regions being of a first conductivity type semiconductor and said second regions being of a second conducting type semiconductor;
potential supplying means connected to said first and second regions; and
conductor means deposited so that each conductor crosses each of said second regions, said conductor means being selectively connected to said third regions, a first group conductors of said conductor means comprising input conductors, and a second group of conductors of said conductor means comprising output conductors.

7. Semiconductor apparatus as defined in claim 6 wherein said first region comprises a collector means, said plurality of second regions comprises base means, and said plurality of third regions comprises emitter means, the first group of conductors being selectively connected to the emitter means so that a particular pattern of logic signals impressed on said first group of conductors uniquely selects one of said second regions, the second group of conductors which are connected to third regions on the selected one of said second regions thereby receiving signals from the third regions connected thereto.

8. Semiconductor apparatus as defined in claim 6 including input means connected to said first group of conductors for supplying input signals thereto, a plurality of second base regions connected each to one of said second group of conductors, said second base regions being positioned on said first region, second emitter regions positioned on each of said second base regions, and output means connected to said second emitter regions.

9. Semiconductor apparatus comprising, in combination:
a first region of a first conductivity type semiconductor material;
a plurality of second regions of a second conductivity type semiconductor material said second regions being positioned on said first region;
a plurality of third regions of semiconductor material positioned on each of said second regions, said third regions being of a conductivity type different from said second regions; and
conductor means positioned over said third regions, said conductor means being selectively connected to said third regions, said conductor means including a first group of conductors and a second group of conductors, said first group of conductors comprising input conductors and said second group of conductors comprising output conductors whereby a signal appears on each output conductor connected to said third regions which are positioned on a particular second region when input signals of particular senses are applied to the input conductors which are connected to third regions positioned on said particular second region.

References Cited

UNITED STATES PATENTS

| | | | |
|---|---|---|---|
| 3,189,758 | 6/1965 | Bell | 307—88.5–21 |
| 3,283,170 | 11/1966 | Buie | 307—88.5–3.82 |

OTHER REFERENCES

Electronics, "Logic Principles for Multi-emitter Transistors" by Thompson, September 1963. Pages 25–29 relied on.

JOHN W. HUCKERT, *Primary Examiner.*

J. D. CRAIG, *Assistant Examiner.*